United States Patent [19]

Cohen et al.

[11] 4,304,839

[45] * Dec. 8, 1981

[54] POSITIVE WORKING MULTILAYER PHOTOSENSITIVE TONABLE ELEMENT

[75] Inventors: Abraham B. Cohen, Springfield; Roxy Fan, East Brunswick, both of N.J.

[73] Assignee: E. I. Du Pont de Nemours and Company, Wilmington, Del.

[*] Notice: The portion of the term of this patent subsequent to Jan. 27, 1998, has been disclaimed.

[21] Appl. No.: 136,992

[22] Filed: Apr. 3, 1980

Related U.S. Application Data

[63] Continuation of Ser. No. 747,028, Dec. 2, 1976, abandoned, which is a continuation-in-part of Ser. No. 583,456, Jun. 3, 1975, abandoned.

[51] Int. Cl.³ .......................... G03C 1/68; G03C 1/76
[52] U.S. Cl. .................................. 430/253; 430/271; 430/273; 430/281; 430/291; 430/275; 430/277; 430/293
[58] Field of Search .............. 430/271, 273, 252, 253, 430/281, 293, 291, 275, 277

[56] References Cited

U.S. PATENT DOCUMENTS

| | | | |
|---|---|---|---|
| 3,607,264 | 9/1971 | Celeste et al. | 430/271 |
| 3,620,726 | 11/1971 | Chu et al. | 96/27 R |
| 3,754,920 | 8/1973 | Kuchta | 430/271 |
| 3,785,817 | 1/1974 | Kuchta | 430/271 |
| 3,891,441 | 6/1975 | Tsuji et al. | 430/271 |

Primary Examiner—Jack P. Brammer

[57] ABSTRACT

An improved photosensitive element comprises a cover sheet, a photoadherent layer, and a tonable contiguous layer receptive to colorant or particulate material for applications such as color proofing. Such elements are capable of producing duplicate images.

28 Claims, 1 Drawing Figure

POSITIVE WORKING MULTILAYER PHOTOSENSITIVE TONABLE ELEMENT

CROSS REFERENCE TO PRIOR APPLICATION

This application is a continuation of application Ser. No. 747,028, filed Dec. 2, 1976 now abandoned, which is a continuation-in-part of application Ser. No. 583,456, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming duplicate images. Such elements are particularly useful for image reproduction for color proofing and related photomechanical uses, e.g., as lithographic transparencies, photomasks, photoresists, etc.

2. Description of the Prior Art

The prior art, e.g., Burg et al., U.S. Pat. Nos. 3,060,024 and 3,060,025; Celeste et al., U.S. Pat. No. 3,607,264; and Phlipot, U.S. Pat. No. 3,236,647, describes photopolymer elements are processes of use. Uncolored, photopolymerizable layers are selectively colored by applying colorants to imagewise exposed, clear photopolymerizable layers, so that the pigment adheres selectively to the unexposed areas. Chu and Cohen, U.S. Pat. No. 3,649,268 describes a process in which an element having a removable support and a photohardenable layer is (1) laminated to a receptor layer, and (2) imagewise exposed through the support to actinic radiation which selectively raises the stick temperature of those areas receiving the radiation, then (3) the support is stripped from the layers, and (4) the outer surface of the layer is treated (e.g., dusted) with a material, usually a colored pigment which adheres only to the unexposed areas of the layer thereby producing a positive image. By repeating the laminating, exposing with color separation records, stripping and treating steps in sequence, a multicolor image can be obtained. However, the elements of the prior art are limited to materials that provide a proper adhesion relationship. Consequently, the quality of the resulting images is affected. In the tonable elements of the prior art, it was desired that the tonable layers have suitable adhesive relationship to toner material in imaged areas as well as to its film supports or laminated substrate. For peel apart elements of the prior art, the resulting images may have pinholes due to improper adhesion between the photosensitive layer and its supports.

SUMMARY OF THE INVENTION

In accordance with this invention improved peel apart photosensitive elements are provided which comprise in order from top to bottom, (1) a strippable cover sheet, (2) a photoadherent layer comprising a material with ethylenically unsaturated or benzophenone type groups, (3) a tonable organic contiguous layer, and optionally (4) a sheet support, after imagewise exposure of said element to actinic radiation, the unexposed areas of said photoadherent layer having greater adhesion to said cover sheet than to said contiguous layer and are removable with said cover sheet, and the exposed areas of said photoadherent layer having greater adhesion to said contiguous layer than to said cover sheet and are not removal with said cover sheet, said exposed areas of the photoadherent layer being nontonable under a condition under which the contiguous layer is tonable.

BRIEF DESCRIPTION OF THE DRAWINGS

The FIGURE of the drawings shows a preferred embodiment comprising a strippable cover sheet (1), a photoadherent layer (2), a contiguous layer (3), and a support (4). The unexposed areas (5) of the photoadherent layer adhere to and are removed with the strippable cover sheet after imagewise exposure of the element to actinic radiation leaving exposed areas (6) of the photoadherent layer remaining on the contiguous layer. The areas (7) of the contiguous layer, which are between the nontonable exposed remaining areas (6) of the photoadherent layer, are then toned. In the particularly preferred embodiment, toning comprises applying pigment particles to areas (7), producing a duplicate toned image.

DESCRIPTION OF THE PREFERRED EMBODIMENTS

Figure 1:
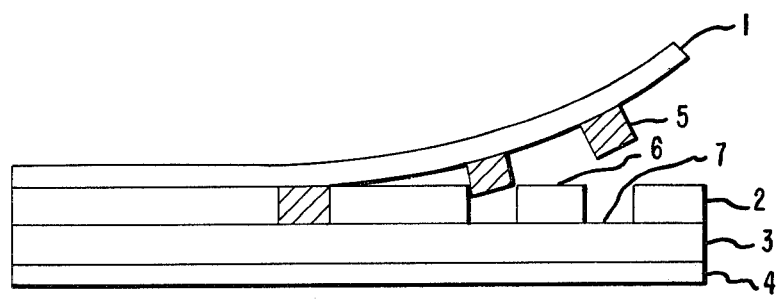

The invention is a versatile photosensitive element capable of producing a variety of images, most preferably duplicate images by a dry process. By "dry process" is meant a process in which liquids need not be used. The photoadherent layer, which is preferably the sole photosensitive layer of the element, is one whose adhesive relationship between the cover sheet and the contiguous layer is altered by exposure to actinic radiation, so that after exposure the exposed areas of the photoadherent layer adhere more strongly to the contiguous layer than to the cover sheet and the unexposed areas are removed with the cover sheet, leaving the exposed areas remaining on the adjacent layer. The exposed areas of the photoadherent layer remaining on the contiguous layer after stripping off the cover sheet must be nontonable under a condition under which the contiguous layer is tonable so that the toner is accepted only by the contiguous layer. This condition may simply be room temperature with other normal ambient conditions; however, it is possible to select materials for the photoadherent layer and contiguous layer which differ in tonability only at an elevated temperature, or after heating and cooling, or in the presence of or after treatment with some reagent, etc. It is only required that under some condition the exposed areas of the photoadherent layer remaining on the contiguous layer be nontonable while said contiguous layer is tonable. By "toning" is meant the application of material which modifies the surface that is toned. Most preferably, toning is the application of colorant or other particulate material. The material, referred to as "toner," may be a colorant such as pigment particles or dye containing material, radiation absorbing material, particulate detackifying material, etc. While it is most preferred to use a dry particulate material as the toner so that image formation is a dry process, dye solutions and other liquids may be used in toning. The exposure and stripping of the cover sheet whereby an imagewise tonable element is formed is always a dry process according to the invention, however. The nontonable property of the remaining areas of the photoadherent layer and the tonable property of the contiguous layer may be due to their respective degrees of tackiness or softness which determine whether particulate material will adhere thereto or be embedded therein when applied, or they may be due to their respective degrees of absorptivity, hydrophilicity or reactivity with respect to the toner. In the most preferred embodiment, the contiguous layer contains more tacky material than the photoadherent layer and will therefore retain particulate material applied at room temperature while the remaining areas of the photoadherent layer will not.

The strippable cover sheet of the element of the invention must be strippable (i.e., removable by peeling it apart) from the rest of the element, carrying with it only unexposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. The cover sheet's surface may be modified; for example, the topography may be altered and the polarity increased by a surface treatment such as electrostatic discharge or flame treatment.

While the thickness of the cover sheet may be varied over a wide range, films having a thickness of 0.001 inch or less are particularly preferred. Thin cover sheets produce halftone dots of good roundness with sharp edges. In addition a tonal range of 2%–98% dot resolution (using a halftone screen with 150 lines/inch) is obtainable with thin cover films. By "tonal range" is meant the range of sizes of resolvable halftone dots as a percentage of a maximum dot size. The cover sheet should be thick enough so that it may be stripped without tearing. The cover sheet may additionally comprise auxiliary treatments or layers to improve adhesion, strength, and other properties.

The exposed areas of the photoadherent layer adhere more strongly to the contiguous layer than to the cover sheet after imagewise exposure to actinic light. Preferably, the photoadherent layer may be comprised of a photohardenable material such as that disclosed in U.S. Pat. No. 3,770,438 or other composition that adheres more strongly to the cover sheet than to the contiguous layer in the unexposed areas and more strongly to the contiguous layer than to the cover sheet in the exposed areas.

After imagewise exposure of the peel apart photosensitive element to actinic radiation, the unexposed areas of the photoadherent layer adhere more strongly to the cover sheet than to the contiguous layer in the unexposed areas and more strongly to the contiguous layer than to the cover sheet in the exposed areas. In preferred embodiments, photohardenable materials are used for the photoadherent layer. Such materials are usually comprised of a material with ethylenically unsaturated or benzophenone-type groups in which an increase in molecular weight and, consequently, an increase in adherence to the contiguous layer are caused by exposure to actinic radiation. The well-known photohardenable materials which are comprised of an ethylenically unsaturated material which is photopolymerizable, photocrosslinkable or photodimerizable or combination thereof are preferred. Particularly preferred are photopolymerizable compositions comprised of a macromolecular organic polymer binder and an addition polymerizable ethylenically unsaturated monomer, which is present in a quantity in excess of the absorptive capacity of the binder for the monomer so that a thin layer of substantially free monomer is present on the surface of a layer of the composition. The monomer has at least one and preferably two or more terminal ethylenically unsaturated groups capable of free radical initiated, chain propagated addition polymerization. In the preferred embodiment, the contact angle of the monomer on the film support should be at least 2° greater than that of the monomer on the contiguous layer, but the monomer should be substantially nondiffusible in the contiguous tonable layer. The photopolymerizable composition will also contain a free radical generating addition polymerization photoinitiating system (i.e., at least one organic photoinitiator compound) activatable by actinic radiation, e.g., ultraviolet and visible radiation.

Among binders which have been found useful, are those disclosed in Celeste U.S. Pat. Nos. 3,770,438 and 3,984,244. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward U.S. Pat. No. 3,573,918. There may be mentioned as examples dipentaerythritol acrylate (50% tetra and 50% penta), pentaerythritol triacrylate and tetra acrylate, polypropylene glycol (50) ether of a pentaerythritol tetraacrylate, polyethylene glycol (200) dimethacrylate, dipentaerythritol monohydroxy penta acrylate, pentaerythritol triacrylate β-hydroxyethyl ether, polypropylene glycol (550) ether of pentaerythritol tetra methacrylate, pentaerythritol tetramethacrylate, polypropylene glycol (425) dimethacrylate, trimethylolpropane trimethacrylate, and polypropylene glycol (340) ether of trimethylol propane triacrylate. Also useful are epoxy monomers containing ethylene unsaturation, e.g., monomers of the type disclosed in U.S. Pat. No. 3,661,576 and British Pat. No. 1,006,587. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made to provide selective photoadherence of resulting exposed image area to the contiguous layer while maintaining or rendering those areas nontonable. Usually, the photoadherent layer will be clear, but for some applications a colored layer may be desired.

The free radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; and Chang, U.S. Pat. No. 3,926,643. Other particularly useful initiating systems are disclosed in Cescon et al., U.S. Pat. No. 3,615,454; Grubb, U.S. Pat. No. 3,647,467; Baum et al., U.S. Pat. No. 3,652,275; Chang, U.S. Pat. No. 3,661,558; and Strilko, U.S. Pat. No. 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific compounds which are particularly useful in the photopolymerizable layers of this invention are 2-(stilbyl-4")-(naphtho-1',2':4,5)-1,2,3-triazol-2"-sulfonic acid phenyl ester hereinafter designated as Brightener I and 7-(4'-chloro-6'-diethylamino- 1',3',5'-triazine-4'-yl) amino-3-phenyl-coumarin hereinafter designated as Brightener II. These compounds are useful in preparing sharp, bright, multicolor images with clean white backgrounds on toning with colorants as shown in U.S. Pat. No. 3,854,950.

While the coating weight of the photoadherent composition may be varied, it has been found that a preferred range from 20–100 mg/dm$^2$ (providing a dry layer thickness of about 0.00006–0.00033 inch) will give good image quality and tonal range. Preferably, the optical density (in the actinic region used) of the coated photoadherent layer should be less than 0.7.

The contiguous layer may be chosen from a great number of materials that will accept toner when bared by removal of areas of the photoadherent layer after imagewise exposure of the element to radiation that is actinic to the photoadherent layer. Preferably, the contiguous layer will be a nonphotosensitive tacky or slightly soft deformable organic material in which a particulate toner may be embedded or adhered. The contiguous layer may be colorless or colored as desired. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, adhesive compositions, etc. Particularly preferred materials are elastomeric polymers and mixtures thereof having a second order transition temperature of −10° C. or lower which are inherently tacky or will accept tackifying agents and which are nonmigratory into said photoadherent layer and which will impart tackiness to the layer. Rubber type polymers, both natural and synthetic may be used, e.g., isobutylene, Thiokol A, nitrile rubbers, butyl rubber, chlorinated rubbers, polymers of butadiene, isoprene poly(vinylisobutyl ether), and random, teleblock and block copolymers of butadiene or isoprene copolymerized with styrene, and neoprene, silicone elastomers, etc., in various proportions. With these materials, a stable adhesion balance between the photoadherent layer and a support for the contiguous layer, in a preferred element, may be achieved for elements useful in making color proof by the overlay method or by the surprint method. These elastomeric materials are also preferred for their good tonability, i.e., ready acceptance and permanent retention of toners, e.g., pigment type colorants, and wide toning temperature latitude. The color density can also be further improved by the addition of tackifiers such as those described in Skeist, *Handbook of Adhesives*, Ch. 4, Reinhold Publishing Corp., 1962. Such tackifiers may comprise a polyterpene resin, a coumarone-indene resin, stabilized glycerol esters of abietic acid resin, stabilized acid wood rosin, a β-pinene polymer, and a cycloaliphatic resin. Particularly useful are the highly stabilized glycerol ester of abietic acid resin and low molecular weight cycloaliphatic hydrocarbon resins, both types having a softening point of about 85° C. The tackifier apparently associates with the rubber network of the elastomer and expands the volume fraction of the rubber phase, which tends to reduce stiffness and provides aggressive tackiness. Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results. In a preferred embodiment, which is illustrated in the drawings, the element has a support (4) for the contiguous layer (3). The support (4) may be any suitable film which has the necessary characteristics for the proper adhesion to layer (3) depending upon how the element is to be used, i.e., for surprint color proofing or overlay color proofing or for making photomasks, litho positives, etc., for photomechanical processes. For color proofing by the overlay method, photographic grade polyethylene terephthalate films which may or may not contain an anchoring layer such as those disclosed in Alles, U.S. Pat. No. 2,779,684 may be used in the overlay method. Similar films which may or may not have a releasable coating, e.g., a silicone coating, may be used for the surprint method of colorproofing. A thermoplastic layer may also be used which allows support (4) to be easily stripped from layer (3) yet holds layers (3) and (4) together when heat laminated or delaminated.

In the case where a thermoplastic layer is used, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

In using the novel film elements of this invention for making a color proofing image of the overlay type, the film elements are exposed to conventional halftone color separation positives by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a continuous motion the cover sheet (1) from the element leaving an unhardened negative image on the cover sheet and, an image of uncovered contiguous layer on the element. The exposed and nontonable image areas of photoadherent layer (2) remain on contiguous layer (3). The tonable image is toned with a suitable colorant, i.e., yellow, magenta, and cyan toning colorants, to give a color record. The process is repeated to produce separate color records which can be assembled in register in any desired order to give a three color proof, each color record being a unitary element by itself. A black toned key image may be and usually is included. The toner is preferably a particulate coloring material, e.g., a dry powder. Suitable toners are disclosed in Chu and Manger, U.S. Pat. No. 3,620,726 and Gray, U.S. Pat. No. 3,909,282. In the case of the overlay method of color proofing, the adhesion of layer (3) to support (4) must be greater than the adhesive forces between layer (3) and the unexposed areas of layer (2).

In the surprint method of color proofing, the adhesion between layer (3) and support (4) must be less than the adhesive forces between layers (2) and (3) and (2) and (1). In the surprint method, support (4) is stripped from the surface of contiguous layer (3), and the surface of layer (3) is adhered to an opaque surface preferably under heat and pressure. Suitable opaque materials may be paper, plastic films, or metal supports, which may have been especially treated to have a higher adhesion for layer (3) than the adhesive forces between layers (2) and (3) and cover sheet (1) and layer (2). The element is then exposed through a color separation positive, e.g., a minus-blue or yellow record, and through the cover sheet (1), and cover sheet (1) is then stripped off generally at an angle of at least 135° to give an unhardened image adhered to cover sheet (1) and bared areas of the contiguous layer (3) corresponding to the unhardened image. The resulting tacky image area is toned with the desired toner, e.g., yellow, and then the process is repeated by laminating the surface of layer (3) of a second element and again carrying out in registration the exposing, stripping and toning operations to give a second toned record, e.g., the magenta image. A third cyan record and a black key record may also be added in the same manner.

The invention provides a particularly preferred element using materials as described which has improved properties particularly suitable for the processes of the invention. The element with the preferred combination of materials comprises, in order, (1) a strippable cover sheet comprised of polymeric film cover sheet which is transparent to actinic radiation, (2) a photohardenable layer which upon imagewise exposure to actinic radiation is non-tonable and adheres to and is removable with said cover sheet only in the unexposed areas, (3) a tacky nonphotosensitive contiguous layer which is tonable by application of particulate material, and (4) a sheet support.

The particulate material can be applied in any manner known in the art, e.g., by dusting, rubbing with a pad or brush, cascading, with air under pressure, etc. The preferred photohardenable material is photopolymerizable, and the preferred cover sheet is polyethylene terephthalate. The preferred contiguous layer material is a tacky elastomer. The tacky contiguous layer may be chosen to provide the proper balance of adhesive properties for the element and furthermore is extremely well suited to toning with particulate material, providing good adherence of particles and wide temperature latitude.

The element and process of the invention are capable of producing duplicate images by a dry process. Accordingly, with an element of the invention, a desired image may be produced simply by exposing, stripping the cover sheet, and toning. The tonable contiguous layer provides a layer whose composition may be selected to provide the proper balance in adhesion between the cover sheet, the photoadherent layer, and the contiguous layer. Consequently, elements of this invention possess improved process characteristics including increased temperature latitude for both the toning and the laminating steps from which high quality color proofs can be produced. Similarly, in elements of this invention wherein the photoadherent layer is colored or pigmented, improved colored images having no pinholes can be produced by simply removing the coversheet with unexposed image areas adherent thereto.

The use of the above-described elements provides a number of additional advantages over the elements of the prior art. An advantage is that because both the photoadherent layer and the tonable contiguous layer can be clear, exposure to actinic radiation can be more efficient, and upon delamination and toning of the bared image areas of the contiguous layer, good, sharp images completely free of background stain are obtained. The integral contiguous layer of this invention eliminates the difficult handling operations in bringing a separate receptor in contact with tacky layers following exposure as is required in the prior art of thermal and pressure transfer processes. Since the contiguous layer is integral with the photoadherent layer during exposure, it also eliminates image distortions which could occur in establishing this contact after exposure. In addition, the contiguous layer and an adherent sheet support provide a sufficiently impermeable barrier to oxygen to prevent oxygen inhibition of the polymerization reaction in the photoadherent layer. The elements of the present invention provide a method of obtaining very uniform color densities over a wide range of toning temperatures. When developed, the elements of the invention produce a novel structure having a polymeric image and a complementary toned image comprising a tonable layer bearing on its surface image areas of polymeric material and complementary toned image areas. Preferably, said toned image areas are areas of the tonable layer to which particulate material has been applied.

EXAMPLE 1

An element was made in the following manner:
I. Photoadherent Layer

A photoadherent layer which adheres to the cover sheet only in the unexposed areas was made of a photopolymerizable coating composition prepared as follows:

| | |
|---|---|
| Chlorinated rubber (Parlon ® S-5 manufactured by Hercules Co.) (67% chlorinated - 20% solution in toluene at 25° C. has a viscosity of 4–7 centipoises). | 22.0 g. |
| Pentaerythritol triacrylate | 15.0 g. |
| 2-t-Butylanthraquinone | 2.0 g. |
| 2,2'Methylene-bis-(9 ethyl-6-t-butylphenol) | 2.0 g. |
| Methyl chloroform | 330.0 g. |

The ingredients were thoroughly mixed and coated using a 0.004-inch doctor knife coating on 0.001-inch polyethylene terephthalate base and allowed to dry.
II. Contiguous Layer: Tonable Tacky Elastomer Coating Composition A coating composition was prepared by mixing together the following ingredients:

| | |
|---|---|
| Cis-polybutadiene (Raw Mooney Typical Viscosity 40) | 360.0 g. |
| Random copolymer of styrene/butadiene (40/60) (Raw Mooney Typical Viscosity 34) | 240.0 g. |
| Tetra bis[methylene 3-(3',5'-di-t-butyl-4'-hydroxyphenyl) propionate]methane | 3.0 g. |
| Methylene chloride | 5400.0 g. |

The resulting solution was coated onto 0.0025-inch transparent polyethylene terephthalate support to to give a dry coating weight of 100 mg/dm².

III. Lamination Procedure

The photoadherent layer (I) and the contiguous layer (II) were laminated together in surface to surface relationship under pressure at 40 pounds per square inch at room temperature.

IV. Exposure, Imaging and Toning Procedure

The laminated elements resulting from Step III were exposed through halftone separation positives (next to 0.001-inch polyethylene terephthalate cover sheet) by means of a pulsed Xenon lamp (nuArc Flip-Top Model 7 ampere) for four minutes. Five minutes after exposure, the 0.001-inch polyethylene terephthalate cover sheet was delaminated (stripped) at an angle at least of 135° and at a rate of about 600 inch/minute (slow rate). The unexposed areas of the clear photopolymerizable layer adhered to the 0.001-inch polyethylene terephthalate cover sheet and were removed with the said cover sheet leaving bared areas of the tonable contiguous layer on 0.0025-inch polyethylene terephthalate support. Complementary exposed image areas remained on the contiguous layer and do not accept toner. Copies from the respective color records for the multicolored final proof were obtained by coloring the elements with the appropriate colored toners in the manner disclosed in U.S. Pat. No. 3,620,726, the blue printer positive being toned with a yellow toner, the green printer positive being toned with a magenta or reddish toner, the red printer positive being toned blue and the black printer positive being toned with a carbon black pigment. The toner was applied by lightly rubbing the element with a fibrous pad containing the toner particles. The toner particles do not adhere to the areas bearing the nontonable exposed photopolymerizable material but do adhere to the areas of the tonable contiguous layer from which the unexposed, photopolymerizable material has been removed, thereby producing a positive working toned image. The elements were then assembled in register to give a quality positive color proof of the overlay type.

EXAMPLE 2

A positive-working color proof of the surprint type is made in the following manner:

I. Multilayered Positive-Working Elements

Four photosensitive elements each comprising, in order, a cover sheet, a photoadherent layer which adheres to the cover sheet only in the unexposed areas, a tonable tacky contiguous layer, a releasable layer, and a sheet support, are prepared as described in Parts I, II, and III of Example 1 except that in Part II, the tonable tacky elastomer coating composition is coated on samples of polyethylene terephthalate film having a releasable layer of polydimethylsiloxane coated thereon.

II. Operations of Constructing a Surprint

The laminated elements resulting from Step I are handled as follows:

The polyethylene terephthalate cover sheet with the release coating is stripped from the tonable tacky layer of an element which is then laminated at 100° C. to a paper support (identified as Kromkote ® marketed by the Champion Paper Corporation). The element is then exposed to a half-tone positive, minus-blue, color separation film record through the clear film cover sheet in contact with the photopolymerizable layer for 4 minutes on an exposing device of Example 1. The element is held for 5 minutes, and the clear film cover sheet is stripped from the tacky layer at an angle of from 135°–180° at a rate of about 600 inches per minute. The unexposed, negative image adheres to the clear film cover sheet thus exposing equivalent areas of the tacky elastomer contiguous layer. The bared areas of the contiguous layer are toned with a yellow toner as described in Example 1. A second photosensitive element is stripped off the release film and laminated to the surface of the yellow image and exposed to a halftone positive minus-green color separation film record in registration, the cover sheet is stripped from the contiguous layer leaving bared a positive image which is toned with a magenta (reddish) toner. The process is repeated for the minus-red and black positive records to give a high quality surprint color proof useful in the lithographic printing arts.

EXAMPLE 3

An element was made in the following manner:

I. Photoadherent Layer

A photoadherent layer which adheres to the cover sheet only in the unexposed areas was made from photosensitive composition prepared with the following ingredients:

| | |
|---|---|
| Polymethyl methacrylate (Inherent Viscosity 0.20–0.22 for a solution of 0.25 g. in 50 mls. chloroform, at 20° C. using a No. 50 Cannon-Fenske Viscosimeter) | 1.55 g. |
| Chlorinated rubber (Parlon ® S-5 by Hercules Powder Company) 67% chlorinated - 20% solution in toluene at 25° C. has a viscosity of 4–7 centipoise) | 21.0 g. |
| Pentaerythritol triacrylate | 20.0 g. |
| 2-Tertiary butyl anthraquinone | 2.1 g. |
| Triethylene glycol acetate | 2.35 g. |
| 2,2'Methylene-bis-(4-ethyl-6-t-butylphenol) | 2.35 g. |
| Victoria Pure Blue (CI 44045) dye | 0.50 g. |
| Methylene chloride | 200.0 g. |

The ingredients were thoroughly mixed and coated using a 0.002-inch doctor knife on a 0.001-inch transparent polyethylene terephthalate base and allowed to dry.

II. Continuous Layer: Tonable Tacky Elastomer Coating Composition

The tonable tacky elastomer coating composition of Example 1, Part II, was coated onto 0.0025-inch transparent polyethylene terephthalate support to give a dry coating weight of 100 mg/dm².

III. Lamination Procedure

Same procedure as that of Example 1, Section III was used.

IV. Exposure, Imaging and Toning Procedure

Laminated elements resulting from Step III were exposed through halftone color separation transparencies (next to the cover sheet) by means of a pulsed Xenon lamp (nuArc Flip-Top Model 17 ampere) for 2 minutes. Five minutes after exposure, the elements were delaminated by peeling the 0.001-inch polyethylene terephthalate cover sheet at an angle of at least 135 degrees and a rate of about 9,000 inches/minute. The unexposed areas of the blue photopolymerizable layer adhered to the 0.001-inch polyethylene terephthalate cover sheet and were removed with the said cover sheet as a positive working image. The complementary exposed blue image areas remained on the contiguous layer and gave a negative working image when toned with a white toner. By repeating the process with appropriate colored photopolymer layers, an overlay color proof could be obtained using the above elements.

EXAMPLE 4

An overlay color proof film is made in the following manner:

I. Photoadherent Layer: Photopolymerizable Coating Composition

A coating solution is made by mixing the following ingredients:

| | |
|---|---|
| Polymethyl methacrylate (Example 3) | 1.0 g. |
| Pentaerythritol triacrylate | 4.8 g. |
| 2-t-Butylanthraquinone | 0.25 g. |
| 2,2'-Methylene-bis-(4 ethyl-6-t-butylphenol) | 0.14 g. |
| Trichloroethylene | 70.0 g. |

The resulting solution is coated using a 0.002 inch doctor knife on a 0.001 inch transparent polyethylene terephthalate film.

II. Contiguous Layer: Tonable Elastomer Coating Composition

A coating solution is prepared by mixing the following ingredients:

| | |
|---|---|
| Block Copolymer of Styrene/Isoprene (15/85) (Brookfield viscosity, 25% solution in toluene measured at 25° C., 1200-2000 cps., Brookfield Viscosimeter, Model LVF, Spindle No. 3 at 6 RPM) | 12.00 g. |
| Methylene chloride to make | 100.0 g. |

The resulting solution is coated on 0.0025 inch thick polyethylene terephthalate film to give a coating weight of 84.0 mg/dm$^2$.

III. Laminating Procedure

Films for each color record (four) from Parts I and II are laminated as described in Example 1.

IV. Operations for Constructing an Overlay Color Proof

Carried out as described in Example 1 to give an overlay color proof.

EXAMPLE 5

Surprint type color-proofing elements are made in the following manner:

I. Photoadherent Layer: Photopolymerizable Composition

A coating solution is prepared as in Example I and is coated on polyethylene terephthalate film having a thickness of 0.0005 inch.

II. Contiguous Layer: Tonable Tacky Elastomer Coating Composition

A 15% solution of a block copolymer of styrene/butadiene (25/75) (Typical Mooney Viscosity ML4 at 100° C. 47) in methylene chloride is coated on an untreated polyethylene film to give a coating weight of about 120 mg/dm$^2$.

III. Laminating Procedure

Samples of the photopolymerizable element are laminated in surface to surface contact with the tacky elastomer layers on the polyethylene at room temperature with a pressure of 40 pounds per square inch.

IV. Preparation of Surprint Color Proofs

Samples from Step III are handled as described in Example 2, part IV, except that the polyethylene film is removed by stripping at an angle of about 180°. Good quality surprint proofs are obtained in all cases.

EXAMPLE 6

Example 2 is repeated except that the tonable tacky elastomer layer is coated on 0.001 inch thick polyethylene film. All other operations of construction and use are carried out as outlined in Example 2 to give a good high quality surprint color-proof image useful in the printing industry.

EXAMPLE 7

Example 2 is repeated except that the tonable layer is coated from a 12% methylene chloride solution of a random copolymer of styrene and butadiene (43/57) (Raw Typical Mooney Viscosity 46) onto a 0.001 inch thick polyethylene terephthalate film which has a polydimethyl siloxane release coating. The coating weight of the tacky tonable elastomer layer is 120 mg/dm$^2$. All other operations are carried out as described in Example 2 to give a good quality color-proof.

EXAMPLE 8

Example 2 is repeated except that the cispolybutadiene and polystyrene/butadiene copolymer in the tacky elastomer of Part II is compounded in the ratio of 70/30. A good quality surprint type color proof is obtained.

EXAMPLE 9

Example 2 is repeated except that the polystyrene copolymer is omitted from the tacky tonable layer coating composition and only the cis-polybutadiene is used in an amount to give a 9% methylene chloride solution. A good quality surprint is produced.

EXAMPLE 10

An element is made in the following manner:

I. Photoadherent Layer

Same as that of Example 1, Part I.

II. Contiguous Layer

A coating solution is prepared from the following materials:

| | |
|---|---|
| Styrene/butadiene block copolymer (25/75) (Typical Mooney Viscosity ML4 at 100° C. 47) | 300.0 g. |
| C.I.S. red 109 dye (1% solution in methanol) | 60.0 g. |
| Methylene chloride | 1700.0 g. |

The resulting solution is coated on 0.0025-inch polyethylene terephthalate support to give a dry coating weight of 90 mg/dm$^2$.

III. Process and Operation

The photoadherent layer (I) and contiguous layer (II) are laminated in surface to surface relationship at room temperature with a pressure of 40 pounds per square inch. After imagewise exposure, the unexposed photopolymerizable material adheres to the 0.0005 inch polyethylene terephthalate cover sheet when delaminated in the normal way. The bared areas of the tonable layer are toned with cyan toner to give a two color image suitable for use as a projection slide for visual aid purpose.

EXAMPLE 11

Positive and negative color proofs are made as follows:

I. Photoadherent Layer

A photoadherent layer containing a colorant which adheres to a 0.001 inch polyethylene terephthalate cover sheet only in the unexposed areas and which photoadheres to the contiguous layer is prepared as described in Example 9 of U.S. Pat. No. 3,770,438.

II. Contiguous Layer: Tonable Tacky Elastomer Coating Composition

The tonable tacky elastomer coating composition of Example 1, Part II, was coated onto 0.0025-inch transparent polyethylene terephthalate support to give a dry coating weight of 100 mg/dm$^2$.

III. Lamination Procedure

Same procedure as that of Example 1, Section III was used.

IV. Exposure, Imaging and Toning Procedure

The laminated element resulting from Step III is exposed for 90 seconds through halftone color separation transparency (next to the cover sheet) to a carbon arc in an exposing device identified as a nuArc Plate Maker. Five minutes after exposure, the element is delaminated by peeling the 0.001-inch polyethylene terephthalate cover sheet at an angle of at least 135 degrees and a rate of about 9,000 inches/minute. The unexposed areas of the blue photopolymerizable layer adhere to the 0.001 inch polyethylene terephthalate cover sheet and are removed with the said cover sheet as a positive working image. This positive image when hardened by uniform exposure to actinic radiation may be used as a positive overlay transparency. The complementary exposed blue image areas remain on the contiguous layer and give a negative working image when toned with a white toner. By repeating the process with appropriate colored photopolymer layers, positive and negative overlay color proofs can be obtained using the above element.

As described above, the developed elements of the invention produce a novel image-bearing structure comprising a tonable layer bearing on its surface image areas of polymeric material and complementary toned image areas. It is particularly useful to produce a multi-layer element comprising a plurality of image-bearing elements of the invention, which has an image that is a composite of the images of the individual elements. In such a multi-layer element the individual elements are laminated successively or assembled in register with the tonable layer of an element adjacent to, and preferably in surface to surface contact with, the image-bearing surface of another element. A multicolor element can thereby be made if images of at least two of the elements are of different colors. Preferably, four elements, each toned a different color, are laminated to produce a multicolor composite image.

In place of colored toners, it is possible to tone the exposed and delaminated layers of this invention with powders which are magnetic, catalytic for various chemical and electrochemical processes, etc. For example, by toning with metal powder, e.g., copper, one obtains an image which can be electrolessly plated to form a circuit element, and by repeated lamination, imaging, stripping, toning with copper powder, and electrolessly plating, one can prepare a multilayer circuit board.

The surface of the color prints shown in the examples can be delustered by laminating the tacky, tonable layer of a fresh element to the print, and without exposing the surface to actinic radiation, stripping off the cover sheet with the photoadherent layer thereon and dusting the tonable layer with a particulate material, e.g., talc, etc. The surface of the exemplified color prints alternatively may be protected by laminating a fresh element and exposing uniformly.

The tacky, tonable, contiguous layer may contain a colorant or pigment and in some applications the layer may have an optical density of at least 3 and preferably 4 to transmitted actinic or visible light. Thus a toned image on an opaque background can be provided as a single color print or as the basis of a multicolor proof. Alternatively, the colorant or pigment may be contained in the sheet support (4) or the sheet support may be an opaque material such as a metal foil, e.g., a copper clad surface. In either instance the sheet support for such applications should have an optical density of at least 3 and preferably 4 to at least a portion of the actinic and visible light spectrum. However, for other applications, such as the use of a toned element as a transparency, the sheet support (4) may have an optical density to visible and actinic light substantially below 3.

EXAMPLE 12

A positive working element was made in the following manner:

I. Photoadherent Layer: Photohardenable Coating Composition

| | |
|---|---|
| Acrylonitrile/styrene/butadiene/methyl methacrylate (3/41/48/9) | 116.0 g. |
| Di-(3-methacryloxy-2-hydroxypropyl) ether of Bisphenol-A | 62.46 g. |
| (2-o-Chlorophenyl-4,5-diphenyl imidazolyl) dimer | 6.6 g. |
| Brightener I (described above) | 1.62 g. |
| Brightener II (described above) | 7.8 g. |
| 2,2'-dihydroxy-4-methoxybenzophenone | 0.6 g. |
| 2-mercaptobenzothiazole | 3.0 g. |
| poly(ethylene oxide) (M.W. ca 1,000,000) | 1.52 g. |
| Methylene chloride | 1600 g. |
| Methanol | 54 g. |

The resulting composition was coated on a 0.005 inch polyethylene terephthalate film whose surface was electrostatic discharge treated at 0.07 coulombs/ft$^2$ and dried to give a coating weight of 88.7 mg/dm$^2$.

II. Contiguous Layer

A coating composition was prepared by mixing together the following ingredients:

| | |
|---|---|
| Cis-polybutadiene (Raw Mooney Typical Viscosity 40) | 80.0 g. |
| Random copolymer of styrene/butadiene (40/60) (Raw Mooney Typical Viscosity 34) | 20.0 g. |
| Tetra bis[methylene 3-(3',5'-di-t-butyl-4'-hydroxyphenyl) propionate]methane | 0.5 g. |
| Methylene chloride | 900.0 g. |

The resulting solution was coated on samples of polyethylene terephthalate film having a releasable layer of polydimethyl siloxane coated thereon to give a coating weight of 75 mg/dm$^2$ and dried to give a layer of cis-polyisobutadiene and polystyrene copolymer in a ratio of 80/20.

III. Laminating Procedure

The coated photopolymerizable element (I) and the tonable tacky layer element (II) were laminated in surface to surface relationship at 80° C. with a pressure of 40 lbs. per square inch.

IV. Operations for Constructing a Print

The laminated elements resulting from Step III were handled as follows:

The polyethylene terephthalate cover sheet with the release coating was stripped from the tonable tacky layer of an element which was then laminated at 100° C. to a paper support (identified as Kromekote® marketed by the Champion Paper Corporation). The element was then exposed to half-tone positive, minus green, color separation film record through treated clear film cover sheet in contact with the photopolymerizable layer for 15 seconds on an exposing device identified as a nuArc Plate Maker (flip-top) manufactured by the nuArc Company, Chicago, Ill. The element was held for 1 minute, and the clear film cover sheet was stripped from the tacky layer at an angle of from 135°–180° at a rate of higher than 720 inches per minute. The unexposed areas of the photopolymer layer adhered to the cover sheet; while the exposed areas of the photopolymer layer adhered to the contiguous layer thus exposing equivalent areas of the tacky elastomer contiguous layer. The bared areas of the contiguous layer were toned with a magenta (reddish) toner as described in Example 1 to give a high quality magenta positive proof. The unexposed photopolymer adhering to the cover sheet was toned as described above to give a positive image on the cover sheet.

We claim:

1. A peel apart photosensitive element comprising in order from top to bottom, (1) a strippable cover sheet comprised of a polymeric film cover sheet which is transparent to actinic radiation, (2) a photoadherent layer comprising photohardenable material with ethylenically unsaturated or benzophenone type groups (3) a tacky, nonphotosensitive organic contiguous layer which is tonable by embedding of particulate material, and (4) a sheet support, the unexposed areas (5) of said photoadherent layer, after imagewise exposure of said element to actinic radiation, having greater adhesion to said cover sheet than to said contiguous layer, and are removable with said cover sheet, and the exposed areas (6) of said photoadherent layer having greater adhesion to said contiguous layer than to said cover sheet and are not removable with said cover sheet, said photoadherent layer being nontonable under a condition under which the contiguous layer is tonable.

2. An element according to claim 1 wherein said contiguous layer (3) is colorless.

3. An element according to claim 1 wherein said photoadherent layer (2) is comprised of an ethylenically unsaturated photohardenable material selected from photopolymerizable, photocrosslinkable, photodimerizable compositions and combinations thereof.

4. An element according to claim 1 wherein said contiguous layer (3) is comprised of a nonphotosensitive elastomeric material.

5. An element according to claim 4 wherein said elastomeric material is selected from butadiene and isoprene polymers.

6. An element according to claim 1 wherein said photoadherent layer (2) is a colorless layer.

7. An element according to claim 1 wherein said photohardenable layer (2) is a photopolymerizable layer comprised of a macromolecular organic polymeric binder, an organic compound having at least one terminal ethylenic group capable of free radical initiated, chain propagated addition polymerization, and a free radical generating addition polymerization photoinitiating system activatable by actinic radiation.

8. An element according to claim 1 wherein said cover sheet (1) is a polyethylene terephthalate film.

9. An element according to claim 1, after imagewise exposure, stripping of the cover sheet (1) and toning, comprises a contiguous layer (3) bearing on its surface image area (6) of polymeric material and complementary toned image areas (7).

10. A multilayer element comprising a plurality of elements of claim 9 wherein the contiguous layer (3) of an element is adjacent to the image-bearing surface of another element.

11. A multicolor element comprising a multilayer element of claim 10 wherein images of at least two of the elements are of different colors.

12. An electrically conductive element comprising an element of claim 9 wherein the complementary toned image areas (7) comprise areas that have been toned with metal powder and plated.

13. An element according to claim 12 wherein the complementary toned image areas comprise areas that have been toned with copper powder and electrolessly plated.

14. A multilayer electrically conductive element comprising a plurality of elements of claim 12 wherein the contiguous layer (3) of an element is in surface to surface contact with the image-bearing surface of another element.

15. An element according to claim 1 wherein, after imagewise exposure and stripping the cover sheet (1), the bared areas (7) of said contiguous layer are receptive to particulate toner, and the exposed areas (6) of said photoadherent layer (2) remaining on the contiguous layer (3) are nonreceptive to particulate toner.

16. An element according to claim 1, wherein after imagewise exposure, stripping of the cover sheet (1) and toning, comprises a contiguous layer (3) bearing on its surface image areas (6) of polymeric material and complementary toned image areas (7).

17. An element according to claim 1 wherein the contiguous layer (3) contains an added colorant.

18. An element according to claim 17 wherein the colored contiguous layer (3) has an optical density of at least 3 over a portion of the visible or actinic spectrum.

19. An element according to claim 1 wherein the photoadherent layer (2) contains an added colorant.

20. An element according to claim 1 wherein the sheet support (4) is transparent to actinic radiation.

21. An element according to claim 1 wherein the sheet support (4) contains an added colorant.

22. An element according to claim 21 wherein the colored sheet support (4) has an optical density of at least 3 over a portion of the visible or actinic spectrum.

23. An element according to claim 1 containing an auxiliary layer interposed between the contiguous layer (3) and the sheet support (4).

24. An element according to claim 23 wherein the auxiliary layer is a release layer.

25. An element according to claim 23 wherein the auxiliary layer is an anchoring layer.

26. An element according to claim 23 wherein the auxiliary layer is thermoplastic.

27. An element according to claim 1 wherein the sheet support (4) has a metal surface in contact with the contiguous layer (3).

28. An element according to claim 27 wherein the metal surface is copper.

* * * * *